(12) United States Patent
Beers

(10) Patent No.: US 6,522,828 B2
(45) Date of Patent: Feb. 18, 2003

(54) ELECTRICAL POWER DISTRIBUTION SYSTEM

(75) Inventor: Robert L. Beers, Shakopee, MN (US)

(73) Assignee: Optical Solutions, Inc., Minneapolis, MN (US)

(*) Notice: Subject to any disclaimer, the term of this patent is extended or adjusted under 35 U.S.C. 154(b) by 15 days.

(21) Appl. No.: 09/902,028

(22) Filed: Jul. 10, 2001

(65) Prior Publication Data

US 2003/0012546 A1 Jan. 16, 2003

(51) Int. Cl.$^7$ .............................. G02B 6/00; G02B 6/36
(52) U.S. Cl. ........................ 385/147; 385/134; 385/92
(58) Field of Search ........................... 385/88, 89, 92, 385/94, 139, 134, 136, 137, 147; 307/34

(56) References Cited

U.S. PATENT DOCUMENTS 5,844,326 A * 12/1998 Proctor et al. ............... 307/34

OTHER PUBLICATIONS

Author: 3M; Title: "Scotch–Weld (TM) Potting Compound/Adhesive DP–270 Clear and Black"; Feb. Date: 1995; Pages 8 Publisher: 3M, St. Paul, Minnesota 55144–1000.

* cited by examiner

Primary Examiner—Loha Ben
Assistant Examiner—Jack Dinh
(74) Attorney, Agent, or Firm—Sonnenschein Nath & Rosenthal

(57) ABSTRACT

An electrical power distribution module for a fiber optic network having a hybrid fiber optic cable. A circuit board in the module includes a source connector connected to a source of electrical power. At least one circuit leg is connected in parallel to the source connector. The circuit leg includes an over-current protection device and a client connection terminal in series therewith. A load can be connected to the connection terminal for providing electrical power thereto.

29 Claims, 3 Drawing Sheets

ELECTRICAL POWER DISTRIBUTION SYSTEM

TECHNICAL FIELD

This invention relates generally to electrical power distribution and, more particularly, to an electrical power distribution system for use in a hybrid fiber optic network.

BACKGROUND

Fiber optic communication networks are gaining in popularity due to the increased bandwidth that they provide and their proven reliability. Fiber optic networks can provide for voice, video and data communications. In this regard, fiber optic networks are being widely implemented to interconnect businesses, home offices, residences, schools, and the like. Further, the growing popularity of the internet is imposing increasing requirements for ultra high bandwidth for both downstream and upstream data communication. Therefore, fiber optic networks are needed to satisfy this ever-increasing demand for bandwidth.

Fiber optic networks typically utilize fiber optic cables that connect a head-end, such as a telephone company's switching office, to a Universal Demarcation Point ("UDP"), such as a home or an office. The fiber optic cables include one or more glass fibers or strands placed in hollow buffer tubes. The number of optical glass fibers and buffer tubes in a fiber optic cable typically varies depending upon the particular implementation, the number of Universal Demarcation Points ("UDPs") on the branch, the bandwidth requirement between the respective connection ends, and the like. Data or information is transported through the glass fibers as light pulses. Electronic equipment at each end of a fiber optic cable converts between electrical signals in an electrical conductor, such as a copper wire, and light pulses in the fiber optic cable.

In such fiber optic networks, electronic equipment and other customer premise equipment ("CPE") associated with the fiber optic network typically requires electrical power for operation. Usually, electrical power is supplied locally at each end of the optical network. The electrical power supplied at a head-end, such as a telephone company's switching office, is usually reliable. At the CPE end of the optical network, commercial power may not be as reliable as the head-end. That commercial electrical power is delivered to the CPE via a plug-in type transformer plugged into the electrical outlet. The transformer converts the commercial electrical power from the outlet to the desired or appropriate voltage required by the CPE.

Commercial sources of electrical power at UDP locations, however, are not always dependable due to the voltage fluctuations and power outages inherent in commercial electrical power distribution. Further, such electrical power supply to the electronics equipment has a failure point in the plug-in type transformer which is susceptible to damage from voltage spikes, black outs, brown outs, and the like that often occur in commercial electrical power. Some transformer type power supplies have a rechargeable battery associated with them to provide an uninterrupted electrical power supply to the CPE during an electrical power outage. In most cases, the rechargeable battery only has an 8 hr. standby time and these rechargeable batteries have to be replaced from time to time due to their limited life span. These limitations limit their utility and dependability as backup sources of power, and add to the cost of maintaining the corresponding equipment. Thus, it is preferable to power CPE equipment from the head-end of the optical network. The head-end electrical power supply can be better regulated by equipment specially designed for that purpose. The head-end may also include back-up power generators that help provide even more reliable electrical power for a longer duration during an extended electrical power outage.

Accordingly, the objects of the present invention include overcoming one or more of the problems set forth above.

SUMMARY OF THE INVENTION

In one aspect of the invention, a fiber optic cable includes a pair of metal conductors in addition to the glass fibers or strands in the cable. The pair of metal conductors can carry electrical power from the head-end at a predetermined voltage. An electrical power distribution module is operatively connected to the pair of metal conductors at each splice case or optical branch that connects to a UDP or CPE or electronic equipment which requires electrical power for operation. The electrical power distribution module can be accommodated in a splice case or other apparatus associated with the fiber optic cable. The electrical power distribution module includes one or more power connectors for connecting CPE or other electronic equipment requiring electrical power. Each of the drop side connectors includes overcurrent protection, such as a fuse, in series with the equipment that is being supplied electrical power from the distribution module.

DETAILED DESCRIPTION

In the present invention, a fiber optic cable is implemented in a fiber optic network. The fiber optic cable includes at least one pair of metal conductors along with the glass fibers in the cable, and may be referred to as a hybrid fiber optic cable. The metal conductors may be any type of metal conductor known in the industry, such as commercially available copper wire. It is recognized that the size of the metal conductor and the number of pairs of metal conductors may vary according to the particular embodiment of the present invention, and will typically depend on the amount of power expected to be carried by the conductors to the CPE or UDPs, the number of UDPs, and the like, in the particular embodiment. In an alternate embodiment, a smaller sized metal conductor may be implemented with the electrical power carried through the cable at a higher voltage. The higher voltage may be stepped down to the desired voltage at the destination location, such as a UDP, by the use of an appropriate transformer or voltage divider.

In one embodiment, the support material required in prior overhead fiber optic cables is reduced, or even removed entirely, from the fiber optic cable because the added metal conductors provide strength and support to the fiber optic cable. Those skilled in the art will appreciate that the amount of additional extraneous support required for the present fiber optic cable, if any, will depend on the size and flexibility of the metal conductors implemented in the cable. It will be appreciated that the reduction or elimination of the support material will help reduce the size, weight and production costs of the present fiber optic cable.

Figure 1:
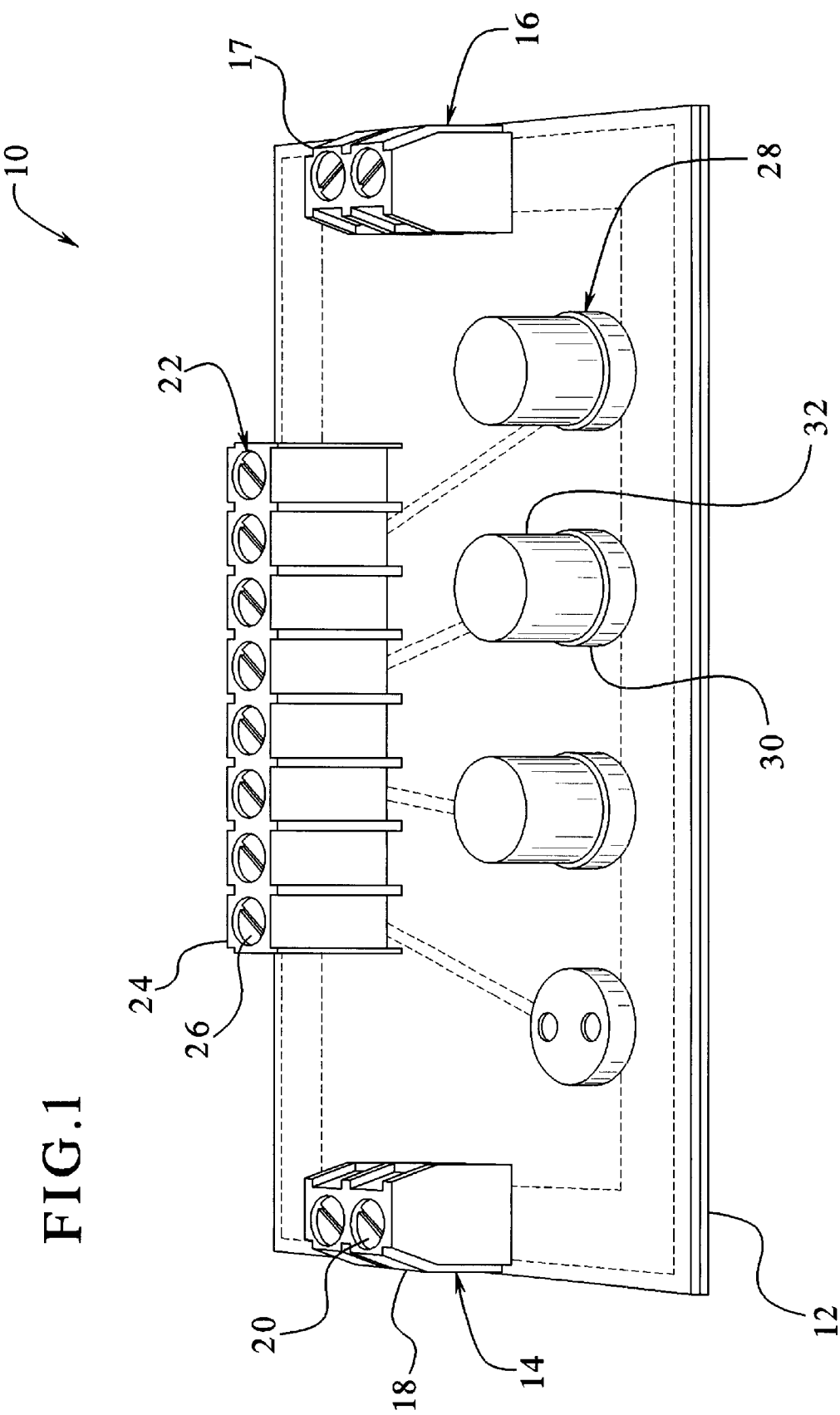
FIG. 1 is a front elevated view of an electrical power distribution module according to one embodiment of the present invention.

Referring to the drawings, numeral 10 in FIG. 1 is an electrical power distribution module according to one embodiment of the present invention. Module 10 is preferably sized to fit into conventional splice boxes or splice cases known in the art for use in fiber optic networks. Typically, each UDP has a splice box or splice case associated therewith where CPE and other electronic equipment at the UDP location taps into the fiber optic cable. In this regard, module 10 shown in FIG. 1 is preferably about 1.5 inches wide, about 2.5 inches long, and about 0.75 inches in height. It is recognized and anticipated, however, that module 10 can be engineered to customize its size for different implementations without departing from the spirit and scope of the present invention. Further, it is recognized and anticipated that module 10 can be implemented outside the splice box, in a separate box, or with the CPE or electronic equipment at the UDP, and therefore it is intended that the claims shall cover all such embodiments that do not depart from the spirit and scope of the present invention.

Figure 2:
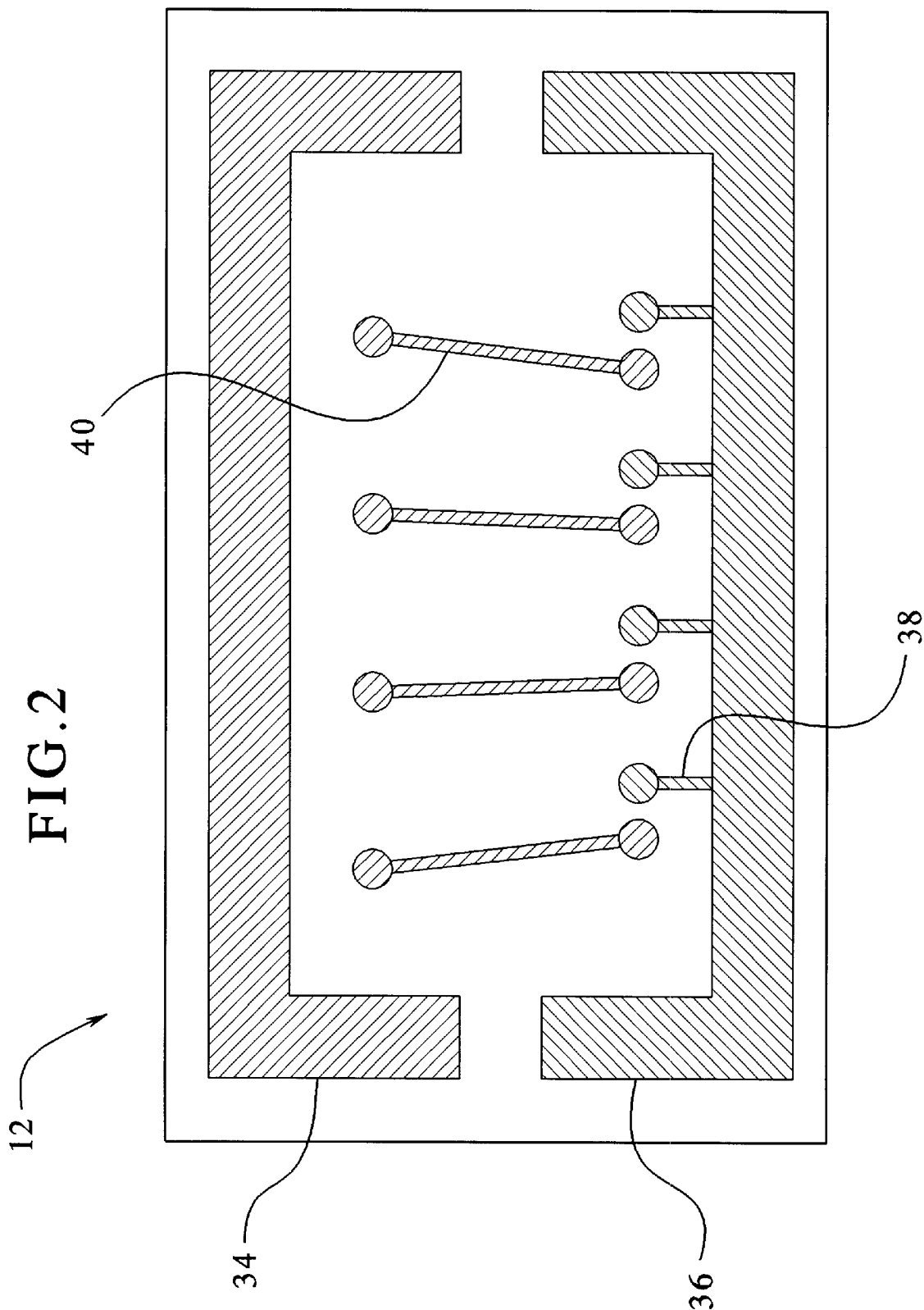
FIG. 2 is a top view of a printed circuit board for the electrical power distribution module of FIG. 1.

Module 10 may include a printed circuit board 12, the circuit and trace layout of which is depicted in FIG. 2 and discussed in more detail below. Implemented upon circuit board 12 are a set of source connectors 14 and a set of supplementary connectors 16. In the embodiment shown, source connectors 14 comprise of a pair of screw down terminals 18 with a hole in each (not visible) for inserting a metal conductor therein. A metal conductor inserted in the hole can be retained therein by operating a corresponding screw 20 in each screw down terminal 18. Screws 20 also helps provide better metal to metal contact between the metal conductor and the electrically conductive components in screw down terminal 18. Each screw down terminal 18 is constructed of an electrically insulated material on the exterior, such as thermoplastic polyester, to insulate the flow of electrical current therethrough. Further, screws 20 in each screw down terminal 18 are recessed in the exterior electrically insulated material when tightened to retain a metal conductor. This feature helps prevent accidental electrical shock to someone who may inadvertently come in contact with the components implemented on circuit board 12. Each screw down terminal 18 is in electrical contact with a corresponding electrically conductive trace on circuit board 12. Such connectors are known in the art and commercially available, and it is recognized that different types of connectors may be substituted in alternate embodiments of the present invention without departing from the spirit and scope of the present invention.

Supplementary connectors 16 (having screws 17 in the depicted embodiment) are preferably substantially identical in design and construction as source connectors 14. However, it is recognized and anticipated that supplementary connectors 16 may be different from source connectors 14 as long as they serve the purpose of bringing a metal conductor in electrical contact with the corresponding electrically conductive trace on circuit board 12.

Also implemented upon circuit board 12 is a set of client connectors 22. Client or drop connectors 22 may comprise of a plurality of screw down terminals 24 having a hole each (not visible) for inserting a metal conductor therein. A metal conductor, such as a copper wire, inserted in the hole can be retained therein with a corresponding screw 26 in screw down terminal 24. Screws 26 also helps provide better metal to metal contact between the metal conductor and the electrically conductive portions of screw down terminal 24. Each screw down terminal 24 is also in electrical contact with a corresponding electrically conductive trace on circuit board 12. Screw down terminals 24 are preferably similar to screw down terminals 18, but it is recognized and anticipated that they may be of a different type.

In the embodiment depicted in FIG. 1, there are eight screw down terminals 24 in the set of client connectors 22. It is recognized and anticipated that this number may vary in different embodiments of the present invention, and it will typically depend on the number of electrical power source terminals desired at the UDP for the particular embodiment. The number of screw down terminals, however, will typically be an even number because one pair of terminals 24 will be necessary, one for a positive electrical connection and one for a negative electrical connection, to connect power to each piece of CPE or other electronic equipment at the UDP. This will become more evident in light of the discussion below.

Also implemented on circuit board 12 are a plurality of over-current protection devices 28. In the embodiment depicted in FIG. 1, over-current protection devices 28 comprise of a base 30 and a replaceable fuse 32 that plugs into base 30. Fuse 32 and base 30 may be of any type known in the art for such applications, and such fuses are commonly available commercially. In FIG. 1, a fuse 32 is shown removed from its corresponding base 30 to better illustrate the implementation of the apparatus. Base 30 of each over-current protection device has two electrically conductive contact members that are in electrical contact with corresponding electrically conductive traces on circuit board 12, and two prongs on each fuse 32 come in electrical contact with each respective contact member in base 30 when fuse 32 is plugged into base 30. It is also recognized and anticipated, however, that a different type of fuse or over-current protection device may be implemented in module 10. It is preferable though that the over-current protection device implemented in module 10 be replaceable, or at least resettable, in the event that electrical current therethrough exceeds a predetermined threshold level and the over-current device is tripped.

There are four over-current protection devices 28 shown is FIG. 1. Each over-current protection device 28 corresponds to a pair of screw down terminals 24 in the set of client connectors 22. It is preferable that module 10 have an over-current protection device 28 corresponding to each pair of screw down terminals 24, but it is recognized and anticipated that alternate embodiments of module 10 may not have an over-current protection device 28 corresponding to each pair of screw down terminals 24. In other embodiments, over-current protection devices 28 may be eliminated altogether. Accordingly, all such embodiments are recognized and anticipated.

Referring to FIG. 2, a top view of a printed circuit board 12 for the electrical power distribution module of FIG. 1 is shown. Towards the edges of circuit board 12 are two electrically conductive traces 34 and 36. Extending from trace 36 are four smaller traces 38 as shown in FIG. 2. Circuit board 12 has four smaller traces 38 because there are four pairs of client connectors 24 in the set of client connectors 22 depicted in FIG. 1. Accordingly, if there were more or less pairs of client connectors 24 in an alternate embodiment of the present invention, that embodiment will have a corresponding number of more or less smaller traces 38. Similarly, there are four longer traces 40 extending from a vicinity of smaller traces 38 to a vicinity of electrically conductive trace 34. Circuit board 12 has four longer traces 40 because of the four pairs of client connectors 24 as discussed above.

To enhance the life and performance of module 10, the surface of the electrically conductive trace side of circuit board 12 in one embodiment is covered with a layer of an insulating material. The insulating material is preferably adequately weather-proof to protect circuit board 12 and the electrically conductive traces thereon from the elements, and also protect any person or animal that comes in contact therewith from electric shock or electrocution. In one embodiment, the layer of insulating material is a Scotch-Weld Potting Material manufactured and marketed commercially by Minnesota Mining and Manufacturing Co. (also referred to as 3M).

Module 10 can be utilized in a fiber optic network which includes a hybrid fiber optic cable with both glass fiber strands and at least one pair of electrical conductors. Each pair of electrical conductors will carry electrical power at a predetermined voltage from the head-end, such as a telephone company's switching office. Typically, this electrical power will be at a voltage between about 70 volts and about 130 volts DC. One of the conductors in each pair of electrical conductors will be a positive terminal, while the other conductor will be a negative terminal. One or more modules 10 can be operatively associated with a UDP which has CPE or other electronic equipment that needs electrical power. Module 10 can tap into one of the pairs of electrical conductors in the hybrid fiber optic cable in any manner known in the art, such as by a splice or by a plug. Positive or negative connections thus tapped from a pair of electrical conductors in the hybrid fiber optic cable can be connected one each to the source terminals 18. One of the source terminals 18 is connected to trace 34, while the other is connected to trace 36. For purposes of this description, we will assume that the positive conductor is connected to the screw down terminal 18 associated with trace 34, and the negative conductor is connected to the other screw down terminal 18 associated with trace 36. In this configuration, it is apparent that all of trace 34 will be energized with positive electrical energy from the positive conductor in the hybrid fiber optic cable, and all of trace 36 will be energized with negative electrical energy from the negative conductor in the hybrid fiber optic cable.

One contact member of each over-current protection device 28 would be in electrical contact with trace 34, and the other contact member of each over-current protection device 28 is in electrical contact with a corresponding longer trace 40. In this manner, in a preferred approach the four over-current protection devices 28 are each connected to trace 34 and a respective longer trace 40. In this configuration, those skilled in the art will see that each over-current protection device 28 will create a series electrical connection between trace 34 and the respective trace 40. Therefore, each longer trace 40 is energized with positive electrical energy via trace 34 and a corresponding over-current protection device 28. Each smaller trace 38, on the other hand, is energized with negative electrical energy via trace 36.

Each screw down terminal 24 in client connectors 22 is in electrical contact with either one of smaller traces 38 or one of longer traces 40. In the preferred embodiment, the connections of screw down terminals 24 alternate between smaller traces 38 and longer traces 40. In other words, the first, third, fifth and seventh screw down terminals 24 are connected to a respective longer trace 40 each, and the second, fourth, sixth and eighth screw down terminals 24 are connected to a respective smaller trace 38 each.

In this implementation, those skilled in the art will appreciate that client connectors 22 will provide four pairs of electrical connections with a positive and a negative terminal each. For each pair of electrical connections, a positive electrical connection is provided from trace 34 via a corresponding over-current protection device 28 and a corresponding longer trace 40, and a negative electrical connection is provided from trace 36 via a corresponding smaller trace 38. Accordingly, up to four different CPE or other electronic equipment at the UDP may be connected to client connectors 22 for electrical power. Those skilled in the art will appreciate that such electrical power will be provided by the head-end, and thus can be controlled as desired by the authorities at the head-end. This will provide a more reliable and effective source of electrical power to the CPE or other electronic equipment connected to module 10 for electrical power, thereby improving the life and performance of the CPE and the other electronic equipment at the UDP.

One embodiment of module 10 includes supplementary connectors 16, which includes two screw down terminals 17. In this embodiment, one screw down terminal 17 is in electrical contact with trace 34 and the other screw down terminal 17 is in electrical contact with trace 36. Those skilled in the art will appreciate that supplemental connectors 16 thus provide additional connectivity to the power source connected to source terminals 14. In this regard, supplemental connectors 16 may be utilized for connecting power to a second module 10 at the UDP, for providing an additional power source or power outlet at the UDP, or the like. Accordingly, supplementary connectors 16 are not essential to the practice of the present invention, but they provide additional scalability if so desired in a particular implementation of the present invention.

Figure 3:
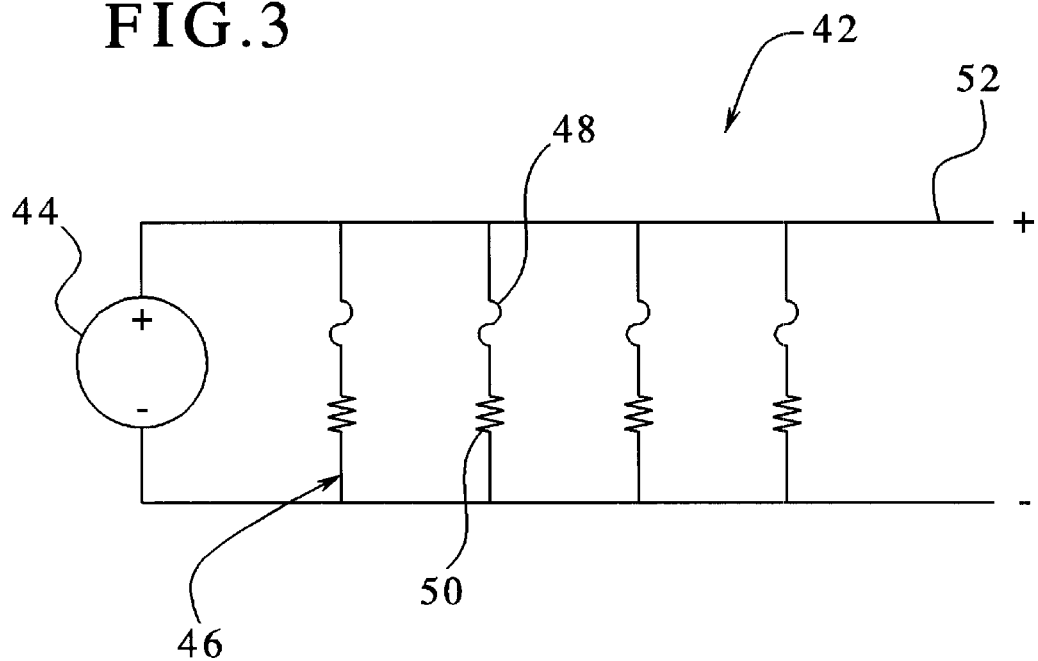
FIG. 3 is an electrical circuit representation of the electrical power distribution module of FIG. 1.

Referring to FIG. 3, an electrical circuit representation 42 of the electrical power distribution module 10 of FIG. 1 is shown. The electrical power delivered by the head-end via electrical conductors in the hybrid fiber optic cable is depicted as a voltage source 44. The circuit 42 includes four circuit legs 46 connected in parallel to voltage source 44, which corresponds to the configuration disclosed in FIGS. 1 and 2. Each circuit leg 46 comprises of an over-current protector 48 and a load 50 connected in series with each other. Over-current protectors 48 correspond to over-current protection devices 28 in module 10, and load 50 corresponds to a CPE or other electronic equipment connected to a pair of electrical connections in client connectors 22 for electrical power. At the end of circuit 42 is a parallel extension 52 of the negative and positive terminals of voltage source 44. Parallel extensions 52 correspond to each of the screw down terminals 17 of supplementary terminals 16 as discussed above.

Circuit 42 thus illustrates how different loads may be powered separately in parallel by module 10. Because each load 50 is in parallel with power source 44, each load 50 will be provided electrical power at the same voltage level as that supplied by power source 44. Each circuit leg 46, which includes a load 50 and an over-current protection device 48, corresponds to a CPE or other electronic equipment that is provided electrical power via module 10, in series with a fuse or another over-current protection device. Further, it will be appreciated that each load 50 will be protected by its corresponding over-current protection device 48. In the event that electrical current through a circuit leg 46 exceeds a predetermined amperage rating of over-current protection device 48, over-current protection device 48 will trip and cause an open circuit in the respective leg, thereby protecting the corresponding equipment represented by load 50 from damage due to the over-current condition. In the embodiment discussed above wherein over-current protection device 28 comprises of a fuse 32, the tripped fuse 32 can simply be replaced when the fuse trips due to an over-current condition. Replacement fuses 32 are usually fairly economical to replace, thereby providing a cost-effective way of protecting the corresponding CPE or electronic equipment at the UDP.

Figure 4:
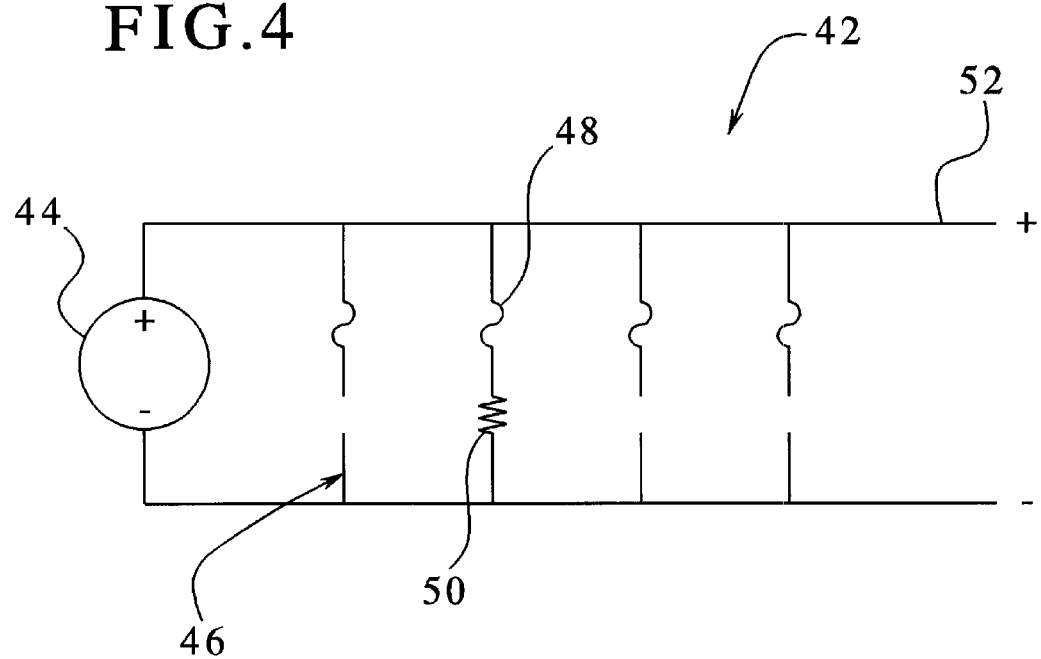
FIG. 4 is an electrical circuit representation of the electrical power distribution module of FIG. 1 with a load connected to only one of a plurality of connectors in the electrical power distribution module.

Referring to FIG. 4, an electrical circuit representation of power distribution module 10 of FIG. 1 is shown with a load connected to only one of the four pairs of electrical connections in client connectors 22 of module 10. This corresponds to three of the four circuit legs 46 in circuit 42 appearing as an electrical open due to the absence of a load connected thereto. This circuit illustrates another important feature of the present invention. When a technician needs to work on a piece of electronic equipment or CPE that is powered by module 10, he may disconnect the corresponding over-current device 28, such as by removing fuse 32, to disable electrical power to the electronic equipment or CPE. This feature provides a convenient way for the technician to protect himself from electric shock while working on the respective electronic equipment or CPE.

The electrical circuit representations of module 10 depicted in FIGS. 3 and 4 illustrate an additional feature provided by the present invention. The number of circuit legs 46 can be customized according to the embodiment of the present invention. Alternate embodiments can have a greater number or a fewer number of circuit legs 46 in comparison to the four circuit legs 46 shown in the drawings. It will be appreciated that having a greater or fewer number of circuit legs 46 is simply a matter of increasing or decreasing the number of screw down connectors 24 in client connectors 22, the corresponding smaller traces 38, the corresponding longer traces 40, and the corresponding over-current protection device 28 in module 10. It is recognized that the number of circuit legs 46 will typically depend upon the amount of electronic equipment and CPE that requires electrical power at the particular UDP.

In one embodiment of module 10, circuit board 12 is a 0.062" CEM-1 1 oz copper single-sided circuit board. Such circuit boards are known in the art and commonly available commercially. Traces 34 and 36 on circuit board 12 are 1 oz copper traces approximately 6 mm wide. At this width, the traces safely handle about 20 amps of electrical current with a temperature rise of only about 20° C. at an ambient temperature of about 68° C. Shorter traces 38 and longer traces 40 are 1 oz copper traces approximately 2 mm wide. At this width, the traces safely handle about 6 amps of electrical current with a temperature rise of only about 20° C. at an ambient temperature of about 68° C. In this embodiment, fuses 32 are commercially available microfuses rated at about 2 amps, and are preferably replaceable. All screw down terminals preferably accommodate metal conductor wires from #22 to #12 AWG, and are preferably listed with UL for 20 amps at 300 volts. The separation between the various traces on circuit board 12 is preferably designed with consideration to the maximum amperage of electrical current to be carried therethrough, and is at least 0.25 inches in the embodiment depicted.

Although the present invention is discussed in terms of DC power, it is recognized and anticipated that the present invention is also applicable for an embodiment with AC power. Those skilled in the art will appreciate that the method and apparatus described above shall be applicable in a substantially similar manner in an embodiment wherein the electrical power delivered to and by module 10 is in AC.

As is evident from the foregoing description, certain aspects of the present invention are not limited to the particular details of the examples illustrated herein, and it is therefore contemplated that other modifications and applications will occur to those skilled in the art. It is, accordingly, intended that the claims shall cover all such modifications and applications that do not depart from the spirit and scope of the present invention.

Other aspects, objects and advantages of the present invention can be obtained from a study of the drawings, the disclosure and the appended claims.

I claim:

1. An electrical power distribution module for a fiber optic network, comprising:
   a circuit board;
   a source connector on said circuit board, said source connector connected to a source of electrical power associated with said fiber optic network; and
   at least one circuit leg connected in parallel to said source connector, said at least one circuit leg comprising a client connection terminal, wherein
   a load can be connected to said client connection terminal for providing electrical power to said load.

2. The power distribution module of claim 1, further comprising an over-current protection device connected in series with said client connection terminal in said circuit leg.

3. The power distribution module of claim 2, wherein said source connector comprises a positive source connector and a negative source connector, said positive source connector connected to a positive electrical conductor in a hybrid fiber optic cable in said fiber optic network, and said negative source connector connected to a negative electrical conductor in said hybrid fiber optic cable.

4. The power distribution module of claim 3, wherein said client connection terminal comprises of a first client connector and a second client connector, said first and second client connectors operable to provide positive and negative electrical power connections in said client connection terminal.

5. The power distribution module of claim 4, further comprising:
   a first electrically conductive trace on said circuit board, said first electrically conductive trace in electrical contact with:
      one of said positive source connector and said negative source connector; and
      said first client connector; and
   a second electrically conductive trace on said circuit board, said second electrically conductive trace in electrical contact with:
      the other of said positive source connector and said negative source connector; and
      said over-current protection device.

6. The power distribution module of claim 2, wherein said over-current protection device comprises a fuse.

7. The power distribution module of claim 6, wherein said fuse comprises of:
   a base; and
   a replaceable fuse plugged into said base.

8. The power distribution module of claim 1, further comprising an electrically conductive trace on said circuit board, said electrically conducting trace in electrical contact with said client connection terminal and with said over-current protection device.

9. The power distribution module of claim 1, further comprising a plurality of circuit legs connected in parallel to said source connector, each of said plurality of circuit legs comprising:
   a client connection terminal; and
   an over-current protection device connected in series with said client connection terminal.

10. The power distribution module of claim 1, further comprising a supplementary connector on said circuit board, said supplementary connector connected in parallel with said source connector.

11. The power distribution module of claim 1, wherein said source connector includes a first screw down connector which can accommodate a metal conductor, said metal conductor being retained in said first screw down connector at least partially by an adjustable screw.

12. The power distribution module of claim 11, wherein said client connection terminal includes a second screw down connector which can accommodate a metal conductor, said metal conductor being retained in said second screw down connector at least partially by an adjustable screw.

13. The power distribution module of claim 1, wherein said circuit board includes a layer of insulation material which at least partially electrically insulates electrically conductive traces on said circuit board.

14. A method of delivering electrical power in a fiber optic network from a source end to electronic equipment located at a UDP, comprising the steps of:
   providing an electrical conductor in a hybrid fiber optic cable between said source end and said UDP;
   providing electrical power to said electrical conductor at said source end;
   connecting an electrical power distribution module in parallel with said electrical conductor at said UDP; and
   connecting said electronic equipment to said electrical power distribution module for providing electrical power to said electronic equipment.

15. The method of claim 14, wherein said electrical power distribution module comprises:
   a circuit board;
   a source connector on said circuit board; and
   at least one circuit leg connected in parallel to said source connector, said at least one circuit leg comprising a client connection terminal.

16. The method of claim 15, wherein said power distribution module further comprises a plurality of circuit legs connected in parallel to said source connector, each of said plurality of circuit legs comprising:
   a client connection terminal; and
   an over-current protection device in series with said client connection terminal.

17. The power distribution module of claim 16, wherein said over-current protection device comprises a fuse.

18. A fiber optic network having an electrical power distribution system, comprising:
   a hybrid fiber optic cable between a source end and a destination end, said hybrid fiber optic cable comprising:
      at least one glass fiber strand; and
      at least one electrical conductor, said at least one electrical conductor carrying electrical power;
   an electrical power distribution module in electrical connection with said at least one electrical conductor at said destination end, said electrical power distribution module comprising:
      a circuit board;
      a source connector on said circuit board, said source connector in electrical connection with said at least one pair of electrical conductors; and
      at least one circuit leg connected in parallel to said source connector, said at least one circuit leg comprising:
         a client connection terminal; and
         an over-current protection device in series with said client connection terminal.

19. The fiber optic network of claim 18, wherein said over-current protection device is a replaceable fuse.

20. The fiber optic network of claim 18, further comprising:
   a positive source connector in said source connector;
   a negative source connector in said source connector;
   a positive client connection terminal in said client connection terminal; and
   a negative client connection terminal in said client connection terminal.

21. The fiber optic network of claim 20, further comprising a first electrically conductive trace on said circuit board, said first electrically conductive trace in electrical contact with one of said positive source connector and said negative source connector, said first electrically conductive trace also in electrical contact with a corresponding positive client connection terminal or negative client connection terminal.

22. The fiber optic network of claim 21, further comprising a second electrically conductive trace on said circuit board, said second electrically conductive trace in electrical contact with the other of said positive source connector and said negative source connector.

23. The fiber optic network of claim 22, further comprising:
   a third electrically conductive trace on said circuit board, said third electrically conductive trace in electrical contact with the other of said positive client connection terminal and said negative client connection terminal;
   a first contact member on said over-current protection device, said first contact member in electrical contact with said second electrically conductive trace; and
   a second contact member on said over-current protection device, said second contact member in electrical contact with said third electrically conductive trace, wherein
   said over-current protection device is in series between said second electrically conductive trace and said third electrically conductive trace.

24. The fiber optic network of claim 18, further comprising:
   a plurality of circuit legs connected in parallel to said source connector, each of said plurality of circuit legs comprising:
      a client connection terminal; and
      an over-current protection device connected in series with said client connection terminal.

25. The fiber optic network of claim 18, further comprising a supplementary connector on said circuit board, said supplementary connector connected in parallel with said source connector.

26. The fiber optic network of claim 18, further comprising a layer of insulation material on said circuit board, said layer of insulation material at least partially electrically insulating electrically conductive traces on said circuit board.

27. The fiber optic network of claim 18, wherein said hybrid fiber optic cable comprises at least one pair of electrical conductors, and said at least one pair of electrical conductors carry electrical power.

28. The fiber optic network of claim 18, wherein said electrical power is in DC voltage.

29. The fiber optic network of claim 18, wherein said electrical power is in AC voltage.

* * * * *